(12) United States Patent
Li et al.

(10) Patent No.: US 9,853,664 B2
(45) Date of Patent: Dec. 26, 2017

(54) RADIO FREQUENCY POWER AMPLIFICATION SYSTEM, RADIO FREQUENCY POWER AMPLIFICATION METHOD, TRANSMITTER, AND BASE STATION

(71) Applicant: Huawei Technologies Co., Ltd., Shenzhen, Guangdong (CN)

(72) Inventors: Xingwen Li, Shanghai (CN); Wei Huang, Chengdu (CN); Siqing Ye, Shenzhen (CN); Jinming Wang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/382,030

(22) Filed: Dec. 16, 2016

(65) Prior Publication Data

US 2017/0149460 A1 May 25, 2017

Related U.S. Application Data

(63) Continuation of application No. PCT/CN2014/080102, filed on Jun. 17, 2014.

(51) Int. Cl.
*H04B 1/04* (2006.01)
*H03F 3/19* (2006.01)
(Continued)

(52) U.S. Cl.
CPC .............. *H04B 1/0475* (2013.01); *H03F 3/19* (2013.01); *H03F 3/211* (2013.01); *H03F 3/245* (2013.01);
(Continued)

(58) Field of Classification Search
USPC ........................ 375/219, 220, 222, 229–236, 375/240.26–240.27, 240, 254, 259, 285,
(Continued)

(56) References Cited

U.S. PATENT DOCUMENTS 5,365,187 A * 11/1994 Hornak ................. H03F 1/3223
330/10
5,712,592 A 1/1998 Stimson et al.
(Continued)

FOREIGN PATENT DOCUMENTS

CN 2514548 Y 10/2002
CN 101091322 A 12/2007
(Continued)

*Primary Examiner* — Linda Wong

(57) ABSTRACT

A apparatus for radio frequency power amplification, a radio frequency power amplification method, a transmitter, and a base station that can reduce nonlinear signal distortion factors are disclosed. The radio frequency power amplification system includes: a radio frequency signal generation circuit, configured to process a baseband digital signal, to obtain an original radio frequency signal; a radio frequency signal processing circuit, configured to process the original radio frequency signal, to obtain N processed radio frequency signals, where N is greater than or equal to 2; a power amplifier, configured to perform power amplification on each of the N processed radio frequency signals, to obtain N amplified radio frequency signals; and a combiner, configured to combine the N amplified radio frequency signals.

13 Claims, 4 Drawing Sheets

(51) Int. Cl.
*H03F 3/24* (2006.01)
*H03F 3/21* (2006.01)

(52) U.S. Cl.
CPC .. *H03F 2200/102* (2013.01); *H03F 2200/451* (2013.01); *H03F 2203/21142* (2013.01); *H04B 2001/0425* (2013.01)

(58) Field of Classification Search
USPC ....... 375/284, 278, 295, 299, 316, 324, 340, 375/346, 354
See application file for complete search history.

(56) References Cited

U.S. PATENT DOCUMENTS

| | | | |
|---|---|---|---|
| 6,731,172 B2 | 5/2004 | Thompson | |
| 6,825,719 B1 | 11/2004 | Barak et al. | |
| 7,142,831 B2 * | 11/2006 | Anvari | H04B 1/0475 330/107 |
| 7,266,159 B2 * | 9/2007 | Vella-Coleiro | H03F 1/3241 330/149 |
| 7,702,301 B2 * | 4/2010 | Rabjohn | H03F 1/3247 330/110 |
| 8,019,015 B2 * | 9/2011 | Moffatt | H03F 1/3247 375/296 |
| 8,604,881 B2 | 12/2013 | Sankalp et al. | |
| 8,712,350 B2 * | 4/2014 | Frambach | H03F 3/193 455/127.1 |
| 2008/0211576 A1 * | 9/2008 | Moffatt | H03F 1/3247 330/149 |
| 2008/0238544 A1 * | 10/2008 | Morris | H03F 1/0288 330/149 |
| 2011/0068868 A1 * | 3/2011 | Shi | H03F 1/3247 330/149 |
| 2012/0025916 A1 | 2/2012 | Deguchi | |
| 2012/0056676 A1 * | 3/2012 | Frambach | H03F 3/193 330/295 |
| 2012/0105166 A1 | 5/2012 | Darges | |
| 2012/0154033 A1 * | 6/2012 | Lozhkin | H03F 1/3247 330/124 R |
| 2013/0257531 A1 * | 10/2013 | Tanio | H03F 1/0211 330/149 |
| 2014/0002186 A1 * | 1/2014 | Kawasaki | H03F 1/3252 330/124 R |
| 2015/0139352 A1 * | 5/2015 | Matsuo | H01Q 3/267 375/295 |

FOREIGN PATENT DOCUMENTS

| | | |
|---|---|---|
| CN | 201869167 U | 6/2011 |
| CN | 102386852 A | 3/2012 |
| EP | 2442441 A2 | 4/2012 |
| WO | 03047093 A1 | 6/2003 |

* cited by examiner

RADIO FREQUENCY POWER AMPLIFICATION SYSTEM, RADIO FREQUENCY POWER AMPLIFICATION METHOD, TRANSMITTER, AND BASE STATION

CROSS-REFERENCE TO RELATED APPLICATIONS

This application is a continuation of International Application No. PCT/CN2014/080102, filed on Jun. 17, 2014, the disclosure of which is hereby incorporated by reference in its entirety.

TECHNICAL FIELD

The present application relates to the field of wireless technologies, and in particular, to a radio frequency power amplification system, a radio frequency power amplification method, a transmitter, and a base station.

BACKGROUND

A radio frequency power amplification system is an important component part of a wireless communications transmitter, and directly determines performance of the transmitter. In the prior art, one of major architectures of a radio frequency power amplification system is an Outphasing (out-of-phase) architecture. A schematic structural diagram of a radio frequency power amplification system using the Outphasing architecture is shown in FIG. 1. An SCS (signal control system) splits an input baseband digital signal into two digital signals and outputs the two digital signals. A DAC digital-to-analog converter) converts each digital signal output by the SCS into an analog signal, and then an AQM (analog quadrature modulation) module performs quadrature modulation on the analog signal and outputs a radio frequency signal to a PA (power amplifier) for power amplification. A Combiner combines the two radio frequency signals.

However, the radio frequency power amplification system using the Outphasing architecture performs signal splitting on a digital signal. Therefore, for each digital signal obtained by means of splitting, a complete amplification link including a DAC, an AQM module, a PA, and other modules is needed, that is, in the radio frequency power amplification system using the Outphasing architecture, two complete amplification links are needed, a quantity of modules used in the system is relatively large, and there are a relatively large quantity of nonlinear signal distortion factors, which adversely affects linear correction.

SUMMARY

Embodiments of the present application provide a radio frequency power amplification system, a radio frequency power amplification method, a transmitter, and a base station, so as to reduce nonlinear signal distortion factors.

According to a first aspect, a radio frequency power amplification system is provided, including:

a radio frequency signal generation circuit, configured to process a baseband digital signal, to obtain an original radio frequency signal; a radio frequency signal processing circuit, configured to process the original radio frequency signal, to obtain N processed radio frequency signals, where N is greater than or equal to 2; a power amplifier, configured to perform power amplification on each of the N processed radio frequency signals, to obtain N amplified radio frequency signals; and a combiner, configured to combine the N amplified radio frequency signals.

With reference to the first aspect, in a first possible implementation manner, an equivalent combined signal of i signals of the N processed radio frequency signals and an equivalent combined signal of the rest j signals except the i signals of the N processed radio frequency signals have equal amplitudes and the amplitudes are all fixed values, and a phase declination of the equivalent combined signal of the i signals that is formed relative to the original radio frequency signal and a phase declination of the equivalent combined signal of the j signals that is formed relative to the original radio frequency signal have a same value and have opposite directions, where i is greater than or equal to 1, and j is greater than or equal to 1.

With reference to the first aspect, or the first possible implementation manner of the first aspect, in a second possible implementation manner, the radio frequency signal processing circuit is specifically configured to: decompose the original radio frequency signal, to obtain a first signal component and a second signal component; and obtain an $n^{th}$ processed radio frequency signal based on a formula $RF_n = k_{n1} \times s_1 + k_{n2} \times s_2$, where $n=1, 2, \ldots,$ or $N$, $RF_n$ is the $n^{th}$ processed radio frequency signal, $s_1$ is the first signal component, $s_2$ is the second signal component, and $k_{n1}$ and $k_{n2}$ are amplitude and phase adjustment coefficients that correspond to the $n^{th}$ processed radio frequency signal at a current moment.

With reference to the second possible implementation manner of the first aspect, in a third possible implementation manner, the radio frequency signal processing circuit is further configured to determine the amplitude and phase adjustment coefficients that correspond to the $n^{th}$ processed radio frequency signal at the current moment, including:

determining, based on a preset $n^{th}$ correspondence between an envelope of the baseband digital signal and an amplitude and phase adjustment coefficient, that an amplitude and phase adjustment coefficient that corresponds to an envelope of the baseband digital signal at the current moment is the amplitude and phase adjustment coefficient that corresponds to the $n^{th}$ processed radio frequency signal at the current moment.

With reference to the third possible implementation manner of the first aspect, in a fourth possible implementation manner, the radio frequency signal processing circuit is further configured to obtain the envelope of the baseband digital signal at the current moment, including:

performing envelope detection on the baseband digital signal, to obtain the envelope of the baseband digital signal at the current moment; or performing envelope detection on the original radio frequency signal, to obtain the envelope of the baseband digital signal at the current moment.

With reference to the third possible implementation manner of the first aspect, or the fourth possible implementation manner of the first aspect, in a fifth possible implementation manner, the radio frequency signal processing circuit is further configured to determine the preset $n^{th}$ correspondence between an envelope of the baseband digital signal and an amplitude and phase adjustment coefficient, including:

determining the preset $n^{th}$ correspondence between an envelope of the baseband digital signal and an amplitude and phase adjustment coefficient according to the baseband digital signal and a preset $n^{th}$ processed radio frequency signal by using a recursive least square algorithm; or determining the preset $n^{th}$ correspondence between an envelope of the baseband digital signal and an amplitude and phase adjustment coefficient according to the original radio frequency signal and a preset $n^{th}$ processed radio frequency signal by using a recursive least square algorithm.

According to a second aspect, a transmitter is provided, including the foregoing radio frequency power amplification system.

According to a third aspect, a base station is provided, including the foregoing transmitter.

According to a fourth aspect, a radio frequency power amplification method is provided, including:

processing a baseband digital signal, to obtain an original radio frequency signal; processing the original radio frequency signal, to obtain N processed radio frequency signals, where N is greater than or equal to 2; performing power amplification on each of the N processed radio frequency signals, to obtain N amplified radio frequency signals; and combining the N amplified radio frequency signals.

With reference to the fourth aspect, in a first possible implementation manner, an equivalent combined signal of i signals of the N processed radio frequency signals and an equivalent combined signal of the rest j signals except the i signals of the N processed radio frequency signals have equal amplitudes and the amplitudes are all fixed values, and a phase declination of the equivalent combined signal of the i signals that is formed relative to the original radio frequency signal and a phase declination of the equivalent combined signal of the j signals that is formed relative to the original radio frequency signal have a same value and have opposite directions, where i is greater than or equal to 1, and j is greater than or equal to 1.

With reference to the fourth aspect, or the first possible implementation manner of the fourth aspect, in a second possible implementation manner, the processing the original radio frequency signal, to obtain N processed radio frequency signals specifically includes:

decomposing the original radio frequency signal, to obtain a first signal component and a second signal component; and obtaining an $n^{th}$ processed radio frequency signal based on a formula $RF_n = k_{n1} \times s_1 + k_{n2} \times s_2$, where $n=1, 2, \ldots,$ or N, $RF_n$ is the $n^{th}$ processed radio frequency signal, $s_1$ is the first signal component, $s_2$ is the second signal component, and $k_{n1}$ and $k_{n2}$ are amplitude and phase adjustment coefficients that correspond to the $n^{th}$ processed radio frequency signal at a current moment.

With reference to the second possible implementation manner of the fourth aspect, in a third possible implementation manner, the method further includes: determining the amplitude and phase adjustment coefficients that correspond to the $n^{th}$ processed radio frequency signal at the current moment, including:

determining, based on a preset $n^{th}$ correspondence between an envelope of the baseband digital signal and an amplitude and phase adjustment coefficient, that an amplitude and phase adjustment coefficient that corresponds to an envelope of the baseband digital signal at the current moment is the amplitude and phase adjustment coefficient that corresponds to the $n^{th}$ processed radio frequency signal at the current moment.

With reference to the third possible implementation manner of the fourth aspect, in a fourth possible implementation manner, the method further includes obtaining the envelope of the baseband digital signal at the current moment, including:

performing envelope detection on the baseband digital signal, to obtain the envelope of the baseband digital signal at the current moment; or performing envelope detection on the original radio frequency signal, to obtain the envelope of the baseband digital signal at the current moment.

With reference to the third possible implementation manner of the fourth aspect, or the fourth possible implementation manner of the fourth aspect, in a fifth possible implementation manner, the method further includes: determining the preset $n^{th}$ correspondence between an envelope of the baseband digital signal and an amplitude and phase adjustment coefficient, including:

determining the preset $n^{th}$ correspondence between an envelope of the baseband digital signal and an amplitude and phase adjustment coefficient according to the baseband digital signal and a preset $n^{th}$ processed radio frequency signal by using a recursive least square algorithm; or determining the preset $n^{th}$ correspondence between an envelope of the baseband digital signal and an amplitude and phase adjustment coefficient according to the original radio frequency signal and a preset $n^{th}$ processed radio frequency signal by using a recursive least square algorithm.

According to a fifth aspect, a radio frequency power amplification device is provided, including: a processor, a memory, and a communications bus, where:

the communications bus is configured to implement a communications connection between the processor and the memory;

the processor is configured to execute an application program stored in the memory; and the memory is configured to store an application program, where the application program includes: processing a baseband digital signal, to obtain an original radio frequency signal; processing the original radio frequency signal, to obtain N processed radio frequency signals, where N is greater than or equal to 2; performing power amplification on each of the N processed radio frequency signals, to obtain N amplified radio frequency signals; and combining the N amplified radio frequency signals.

With reference to the fifth aspect, in a first possible implementation manner, an equivalent combined signal of i signals of the N processed radio frequency signals and an equivalent combined signal of the rest j signals except the i signals of the N processed radio frequency signals have equal amplitudes and the amplitudes are all fixed values, and a phase declination of the equivalent combined signal of the i signals that is formed relative to the original radio frequency signal and a phase declination of the equivalent combined signal of the j signals that is formed relative to the original radio frequency signal have a same value and have opposite directions, where i is greater than or equal to 1, and j is greater than or equal to 1.

With reference to the fifth aspect, or the first possible implementation manner of the fifth aspect, in a second possible implementation manner, the application program specifically includes: decomposing the original radio frequency signal, to obtain a first signal component and a second signal component; and obtaining an $n^{th}$ processed radio frequency signal based on a formula $RF_n = k_{n1} \times s_1 + k_{n2} \times s_2$, where $n=1, 2, \ldots,$ or N, $RF_n$ is the $n^{th}$ processed radio frequency signal, $s_1$ is the first signal component, $s_2$ is the second signal component, and $k_{n1}$ and $k_{n2}$ are amplitude and phase adjustment coefficients that correspond to the $n^{th}$ processed radio frequency signal at a current moment.

With reference to the second possible implementation manner of the fifth aspect, in a third possible implementation manner, the application program further includes: determining the amplitude and phase adjustment coefficients that correspond to the $n^{th}$ processed radio frequency signal at the current moment, including:

determining, based on a preset $n^{th}$ correspondence between an envelope of the baseband digital signal and an amplitude and phase adjustment coefficient, that an amplitude and phase adjustment coefficient that corresponds to an envelope of the baseband digital signal at the current moment is the amplitude and phase adjustment coefficient that corresponds to the $n^{th}$ processed radio frequency signal at the current moment.

With reference to the third possible implementation manner of the fifth aspect, in a fourth possible implementation manner, the application program further includes: obtaining the envelope of the baseband digital signal at the current moment, including:

performing envelope detection on the baseband digital signal, to obtain the envelope of the baseband digital signal at the current moment; or performing envelope detection on the original radio frequency signal, to obtain the envelope of the baseband digital signal at the current moment.

With reference to the third possible implementation manner of the fifth aspect, or the fourth possible implementation manner of the fifth aspect, in a fifth possible implementation manner, the application program further includes: determining the preset $n^{th}$ correspondence between an envelope of the baseband digital signal and an amplitude and phase adjustment coefficient, including:

determining the preset $n^{th}$ correspondence between an envelope of the baseband digital signal and an amplitude and phase adjustment coefficient according to the baseband digital signal and a preset $n^{th}$ processed radio frequency signal by using a recursive least square algorithm; or determining the preset $n^{th}$ correspondence between an envelope of the baseband digital signal and an amplitude and phase adjustment coefficient according to the original radio frequency signal and a preset $n^{th}$ processed radio frequency signal by using a recursive least square algorithm.

According to the radio frequency power amplification system provided in the first aspect, the transmitter provided in the second aspect, the base station provided in the third aspect, the radio frequency power amplification method provided in the fourth aspect, and the radio frequency power amplification device provided in the fifth aspect, an original radio frequency signal is obtained based on a current baseband digital signal, the original radio frequency signal is processed, to obtain multiple processed radio frequency signals, power amplification is performed on each processed radio frequency signal, and multiple amplified radio frequency signals are then combined. That is, in the solution provided in the present application, signal splitting is performed on a radio frequency signal, and a quantity of modules in a system is reduced. Therefore, nonlinear signal distortion factors are reduced, which facilitates linear correction.

BRIEF DESCRIPTION OF THE DRAWINGS

The accompanying drawings are used to help further understand the present application, and constitute a part of the specification, and are used, together with embodiments of the present application, to explain the present application, but not constitute any limitation to the present application. In the accompanying drawings.

DETAILED DESCRIPTION

The embodiments of the present application provide a radio frequency power amplification system, a radio frequency power amplification method, a transmitter, and a base station. The following describes embodiments of the present application with reference to the accompanying drawings of the specification. It should be understood that, the preferred embodiments described herein are merely used to describe and explain the present application, but are not used to limit the present application. The embodiments in this application and features in the embodiments can be combined with each other in the case of no conflict.

The radio frequency power amplification system and the radio frequency power amplification method provided in the embodiments of the present application may be applied to various scenarios in the field of wireless technologies, and the scenarios include, but are not limited to, a mobile communications system, a fixed wireless access system, a wireless data transmission system, and a radar system, which is not specially limited in the embodiments of the present application.

Figure 1:
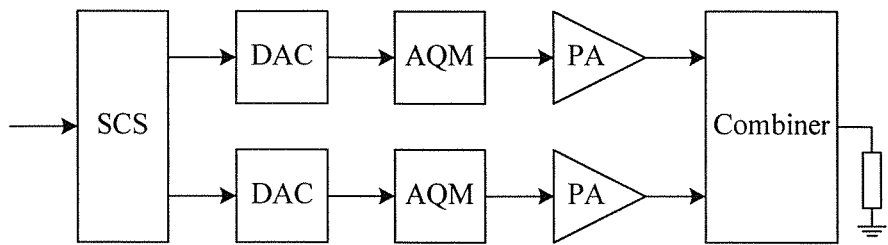
FIG. 1 is a schematic structural diagram of a radio frequency power amplification system in the prior art.
Figure 2:
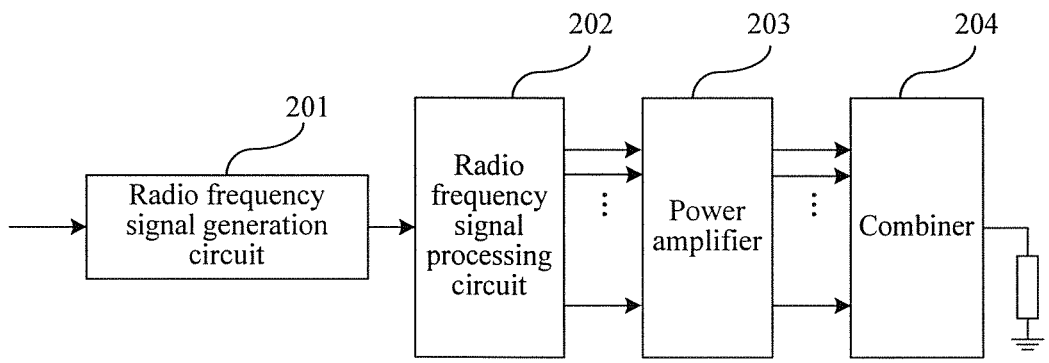
FIG. 2 is a schematic structural diagram of a radio frequency power amplification system according to an embodiment of the present application.

An embodiment of the present application provides a radio frequency power amplification system. As shown in FIG. 2, the radio frequency power amplification system includes:

a radio frequency signal generation circuit 201, configured to process a baseband digital signal, to obtain an original radio frequency signal;

a radio frequency signal processing circuit 202, configured to process the original radio frequency signal, to obtain N processed radio frequency signals, where N is greater than or equal to 2;

a power amplifier 203, configured to perform power amplification on each of the N processed radio frequency signals, to obtain N amplified radio frequency signals; and a combiner 204, configured to combine the N amplified radio frequency signals.

Specific forms of the N processed radio frequency signals output by the radio frequency signal processing circuit 202 are not specially limited in this embodiment of the present application. For example, an equivalent combined signal of i signals of the N processed radio frequency signals and an equivalent combined signal of the rest j signals except the i signals of the N processed radio frequency signals may have equal amplitudes and the amplitudes are all fixed values, and a phase declination of the equivalent combined signal of the i signals that is formed relative to the original radio frequency signal and a phase declination of the equivalent combined signal of the j signals that is formed relative to the original radio frequency signal have a same value and have opposite directions, where i is greater than or equal to 1, and j is greater than or equal to 1.

The equivalent combined signal of the i signals is a signal obtained when it is assumed that a combination operation is performed on the i signals, and the equivalent combined signal of the j signals is a signal that is obtained when it is assumed that a combination operation is performed on the j signals. That is, an amplitude and phase relationship between the equivalent combined signal of the i signals and the equivalent combined signal of the j signals is substantially a condition that should be met by the N processed radio frequency signals that are obtained by means of processing by the radio frequency signal processing circuit 202, instead of that a real combination operation is performed on the i signals and j signals.

For example, in a specific embodiment of the present application, the radio frequency signal processing circuit 202 may specifically process the original radio frequency signal to obtain two processed radio frequency signals. The two processed radio frequency signals should meet the following conditions:

The two processed radio frequency signals have equal amplitudes and the amplitudes are all fixed values, a phase declination, of one processed radio frequency signal, that is formed relative to the original radio frequency signal and a phase declination, of the other processed radio frequency signal, that is formed relative to the original radio frequency signal have a same value and have opposite directions. For example, when a phase declination, of one processed radio frequency signal, that is formed relative to the original radio frequency signal is +15°, a phase declination, of the other processed radio frequency signal, that is formed relative to the original radio frequency signal is −15°.

That is, in this case, N=2, i=1, j=1, the one processed radio frequency signal of the two processed radio frequency signals is equivalent to the i signals of the N processed radio frequency signals, and the processed radio frequency signal itself is equivalent to the equivalent combined signal of the i signals. The other processed radio frequency signal of the two processed radio frequency signals is equivalent to the rest j signals of the N processed radio frequency signals except the i signals, and the processed radio frequency signal itself is equivalent to the equivalent combined signal of the j signals.

For another example, in another specific embodiment of the present application, the radio frequency signal processing circuit 202 may specifically process the original radio frequency signal to obtain three processed radio frequency signals. The three processed radio frequency signals should meet the following conditions:

An equivalent combined signal of any two processed radio frequency signals of the three processed radio frequency signals and another processed radio frequency signal except the two processed radio frequency signals have equal amplitudes and the amplitudes are all fixed values. A phase declination of the equivalent combined signal of the two processed radio frequency signals that is formed relative to the original radio frequency signal and a phase declination, of the another processed radio frequency signal, that is formed relative to the original radio frequency signal have a same value and have opposite directions.

That is, in this case, N=3, i=2, j=1, the two processed radio frequency signals of the three processed radio frequency signals are the i signals of the N processed radio frequency signals, and the equivalent combined signal of the two processed radio frequency signals is the equivalent combined signal of the i signals. The another processed radio frequency signal of the three processed radio frequency signals except the two processed radio frequency signals is equivalent to the rest j signals of the N processed radio frequency signals except the i signals, and the processed radio frequency signal itself is equivalent to the equivalent combined signal of the j signals.

In another specific embodiment of the present application, the radio frequency signal processing circuit 202 may specifically process the original radio frequency signal to obtain more than three processed radio frequency signals, and no example is given herein.

Further, the radio frequency signal processing circuit 202 is specifically configured to: decompose the original radio frequency signal, to obtain a first signal component and a second signal component; and obtain an $n^{th}$ processed radio frequency signal based on the following formula:

$$RF_n = k_{n1} \times s_1 + k_{n2} \times s_2, \text{ where}$$

n=1, 2, . . . , or N, $RF_n$ is the $n^{th}$ processed radio frequency signal, $s_1$ is the first signal component, $s_2$ is the second signal component, and $k_{n1}$ and $k_{n2}$ are amplitude and phase adjustment coefficients that correspond to the $n^{th}$ processed radio frequency signal at a current moment.

In an actual implementation, calculation of the formula may be implemented by using a multiplier.

Optionally, the radio frequency signal processing circuit 202 is specifically configured to perform orthogonal decomposition on the original radio frequency signal, to obtain a first signal component and a second signal component.

In an actual implementation, orthogonal decomposition may be performed on the original radio frequency signal by using a QPS (Quadrature Phase Splitter, quadrature phase splitter).

The specific calculation method used by the radio frequency signal processing circuit 202 to obtain the $n^{th}$ processed radio frequency signal is only an example, which is not used to limit the present application.

Further, the radio frequency signal processing circuit 202 is further configured to determine the amplitude and phase adjustment coefficients that correspond to the $n^{th}$ processed radio frequency signal at the current moment, including:

determining, based on a preset $n^{th}$ correspondence between an envelope of the baseband digital signal and an amplitude and phase adjustment coefficient, that an amplitude and phase adjustment coefficient that corresponds to an envelope of the baseband digital signal input by the radio frequency signal generation circuit 201 at the current moment is the amplitude and phase adjustment coefficient that corresponds to the $n^{th}$ processed radio frequency signal at the current moment.

In an actual implementation, the preset $n^{th}$ correspondence between an envelope of the baseband digital signal and an amplitude and phase adjustment coefficient may be stored by using a LUT (Look Up Table, lookup table). The amplitude and phase adjustment coefficient that corresponds to the $n^{th}$ processed radio frequency signal at the current moment is determined according to the envelope of the baseband digital signal at the current moment.

Further, the radio frequency signal processing circuit 202 is further configured to obtain the envelope of the baseband digital signal at the current moment, including:

performing envelope detection on the baseband digital signal, to obtain the envelope of the baseband digital signal at the current moment; or performing envelope detection on the original radio frequency signal obtained by means of processing by the radio frequency signal generation circuit 201, to obtain the envelope of the baseband digital signal at the current moment.

When the envelope of the baseband digital signal at the current moment is directly determined according to the baseband digital signal, a result is more accurate.

In an actual implementation, envelope detection may be performed on the baseband digital signal or the original radio frequency signal by using an ABS (envelope detector).

If an input end of the radio frequency power amplification system is provided with an SCS, because the SCS has a function of envelope detection, the SCS may determine the envelope of the baseband digital signal at the current moment. In this case, the radio frequency signal processing circuit 202 does not need to obtain the envelope of the baseband digital signal at the current moment by performing envelope detection on the baseband digital signal or the original radio frequency signal. The radio frequency signal processing circuit 202 may directly obtain the envelope of the baseband digital signal at the current moment from the SCS.

Further, the radio frequency signal processing circuit 202 is further configured to determine the preset $n^{th}$ correspondence between an envelope of the baseband digital signal and an amplitude and phase adjustment coefficient, including:

determining the preset $n^{th}$ correspondence between an envelope of the baseband digital signal and an amplitude and phase adjustment coefficient according to the baseband digital signal and a preset $n^{th}$ processed radio frequency signal by using, including but not limited to, a recursive least square algorithm; or determining the preset $n^{th}$ correspondence between an envelope of the baseband digital signal and an amplitude and phase adjustment coefficient according to the original radio frequency signal and a preset $n^{th}$ processed radio frequency signal by using, including but not limited to, a recursive least square algorithm.

The preset $n^{th}$ processed radio frequency signal is an $n^{th}$ processed radio frequency signal that is expected to be obtained, and may be specifically set according to an actual application scenario.

Optionally, power amplification may be specifically and performed on each of the N processed radio frequency signals by using N PAs, where each PA corresponds to one processed radio frequency signal.

The following describes, by examples, the radio frequency power amplification system by using specific embodiments.

Embodiment 1

Figure 3:
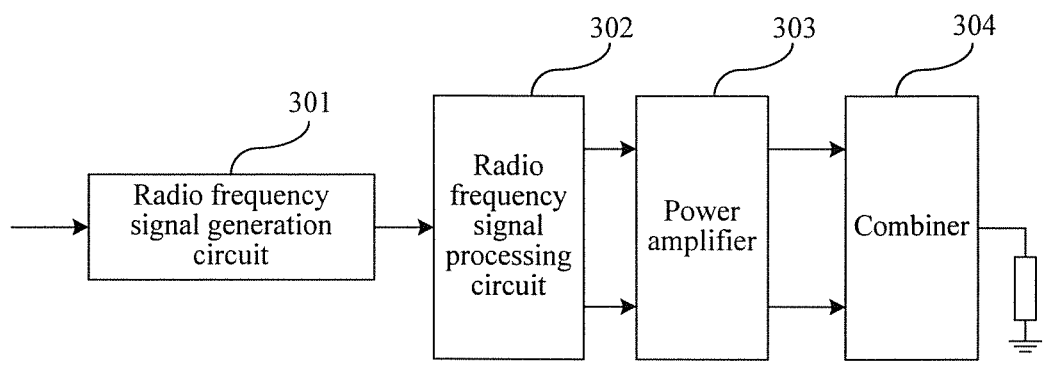
FIG. 3 is a schematic structural diagram of a radio frequency power amplification system according to Embodiment 1 of the present application.

FIG. 3 shows a radio frequency power amplification system according to Embodiment 1 of the present application. The radio frequency power amplification system includes:

a radio frequency signal generation circuit 301, configured to process a baseband digital signal, to obtain an original radio frequency signal;

a radio frequency signal processing circuit 302, configured to process the original radio frequency signal, to obtain a first processed radio frequency signal and a second processed radio frequency signal;

a power amplifier 303, configured to perform power amplification on each of the first processed radio frequency signal and the second processed radio frequency signal, to obtain a first amplified radio frequency signal and a second amplified radio frequency signal; and a combiner 304, configured to combine the first amplified radio frequency signal and the second amplified radio frequency signal.

Further, the radio frequency signal generation circuit 301 is specifically configured to: perform digital-to-analog conversion on the baseband digital signal, to obtain an analog signal; and perform quadrature modulation on the analog signal, to obtain the original radio frequency signal.

In Embodiment 1 of the present application, the first processed radio frequency signal and the second processed radio frequency signal that are obtained by the radio frequency signal processing circuit 302 may have equal amplitudes and the amplitudes are all fixed values. In addition, a phase declination, of the first processed radio frequency signal, that is formed relative to the original radio frequency signal and a phase declination, of the second processed radio frequency signal, that is formed relative to the original radio frequency signal have a same value and have opposite directions.

Further, the radio frequency signal processing circuit 302 is specifically configured to: perform orthogonal decomposition on the original radio frequency signal, to obtain a first signal component and a second signal component; and obtain the first processed radio frequency signal based on the following formula:

$$RF_1 = k_{11} \times s_1 + k_{12} \times s_2; \text{ and}$$

obtain the second processed radio frequency signal based on the following formula:

$$RF_2 = k_{21} \times s_1 + k_{22} \times s_2, \text{ where}$$

$RF_1$ is the first processed radio frequency signal,
$RF_2$ is the second processed radio frequency signal,
$s_1$ is the first signal component,
$s_2$ is the second signal component,
$k_{11}$ and $k_{12}$ are amplitude and phase adjustment coefficients that correspond to the first processed radio frequency signal at a current moment, and
$k_{21}$ and $k_{22}$ are amplitude and phase adjustment coefficients that correspond to the second processed radio frequency signal at the current moment.

In another embodiment of the present application, the radio frequency signal processing circuit 302 may also perform non-orthogonal decomposition on the original radio frequency signal, to obtain a first signal component and a second signal component. A specific decomposition manner is not limited in the present application.

In another embodiment of the present application, the radio frequency signal processing circuit 302 may further obtain the first processed radio frequency signal and the second processed radio frequency signal by using another calculation method. The specific calculation method is not limited in the present application.

Further, the radio frequency signal processing circuit 302 may be specifically configured to determine, in the following manner, an amplitude and phase adjustment coefficient that corresponds to the first processed radio frequency signal at the current moment:

determining, based on a preset first correspondence between an envelope of the baseband digital signal and an amplitude and phase adjustment coefficient, that an amplitude and phase adjustment coefficient that corresponds to an envelope of the baseband digital signal at the current moment is an amplitude and phase adjustment coefficient that corresponds to the first processed radio frequency signal at the current moment.

Correspondingly, the radio frequency signal processing circuit 302 may be specifically configured to determine, in the following manner, an amplitude and phase adjustment coefficient that corresponds to the second processed radio frequency signal at the current moment:

determining, based on a preset second correspondence between an envelope of the baseband digital signal and an amplitude and phase adjustment coefficient, that an amplitude and phase adjustment coefficient that corresponds to an envelope of the baseband digital signal at the current moment is an amplitude and phase adjustment coefficient that corresponds to the second processed radio frequency signal at the current moment.

Figure 4:
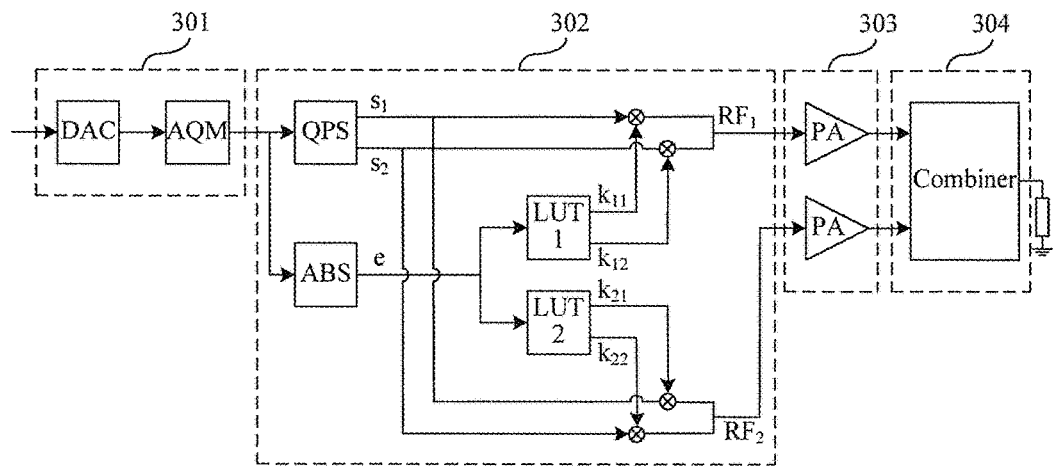
FIG. 4 is a first schematic structural diagram of an implementation of the radio frequency power amplification system according to Embodiment 1 of the present application.

In an actual implementation, an implementation structure of the radio frequency power amplification system may be shown in FIG. 4.

The radio frequency signal generation circuit 301 may be implemented by using a DAC and an AQM module. The DAC converts the baseband digital signal into an analog signal, and then the AQM module performs quadrature modulation on the analog signal, to obtain an original radio frequency signal. A connection relationship between the DAC and the AQM module is shown in FIG. 4.

The radio frequency signal processing circuit 302 may be implemented by using a QPS, an ABS, a LUT1, a LUT2, and a multiplier, and a relationship between the modules is shown in FIG. 4. The QPS performs orthogonal decomposition on the original radio frequency signal to obtain the first signal component $s_1$ and the second signal component $s_2$. The ABS performs envelope detection on the original radio frequency signal, to obtain an envelope e of the baseband digital signal at the current moment. The LUT1 stores a preset first correspondence between an envelope of the baseband digital signal and an amplitude and phase adjustment coefficient, and the amplitude and phase adjustment coefficients $k_{11}$ and $k_{12}$ that correspond to the first processed radio frequency signal are determined according to the envelope e of the baseband digital signal at the current moment. The LUT2 stores a preset second correspondence between an envelope of the baseband digital signal and an amplitude and phase adjustment coefficient, and the amplitude and phase adjustment coefficients $k_{21}$ and $k_{22}$ that correspond to the second processed radio frequency signal are determined according to the envelope e of the baseband digital signal at the current moment. Finally, the first processed radio frequency signal $RF_1$ may be obtained by means of calculation according to the first signal component $s_1$, the second signal component $s_2$, and the amplitude and phase adjustment coefficient $k_{11}$ and $k_{12}$ that correspond to the first processed radio frequency signal, and the second processed radio frequency signal $RF_2$ may be obtained by means of calculation according to the first signal component $s_1$, the second signal component $s_2$, and the amplitude and phase adjustment coefficients $k_{21}$ and $k_{22}$ that correspond to the second processed radio frequency signal.

In Embodiment 1 of the present application, the power amplifier 303 may be specifically implemented by using two PAs. One PA performs power amplification on the first processed radio frequency signal $RF_1$, and the other PA performs power amplification on the second processed radio frequency signal $RF_2$.

The combiner 304 combines the first amplified radio frequency signal and the second amplified radio frequency signal and outputs a combined signal.

Figure 5:
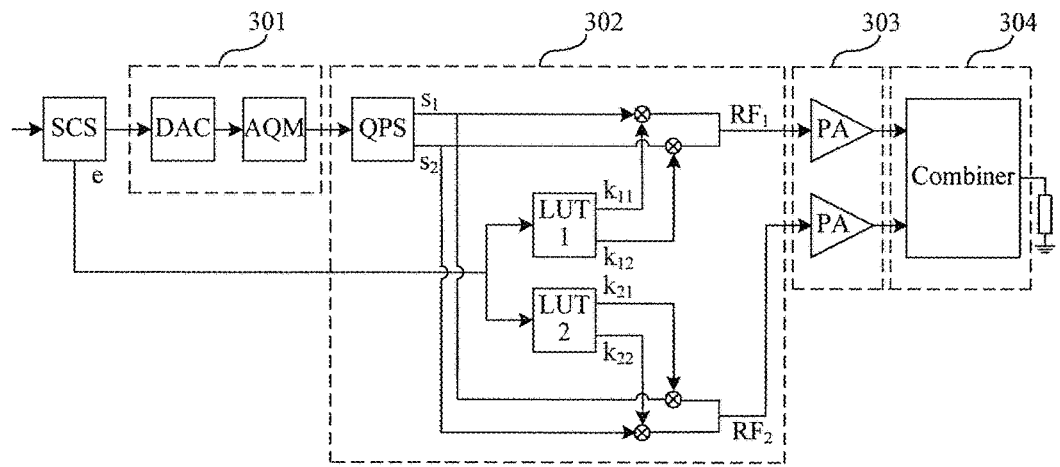
FIG. 5 is a second schematic structural diagram of an implementation of the radio frequency power amplification system according to Embodiment 1 of the present application.

Optionally, the implementation structure of the radio frequency power amplification system may further be shown in FIG. 5. In comparison with the radio frequency power amplification system shown in FIG. 4, an input end is provided with an SCS to forward the baseband digital signal. The radio frequency signal processing circuit 302 may directly obtain the envelope e of the baseband digital signal at the current moment from the SCS, so that higher accuracy is achieved.

Figure 6:
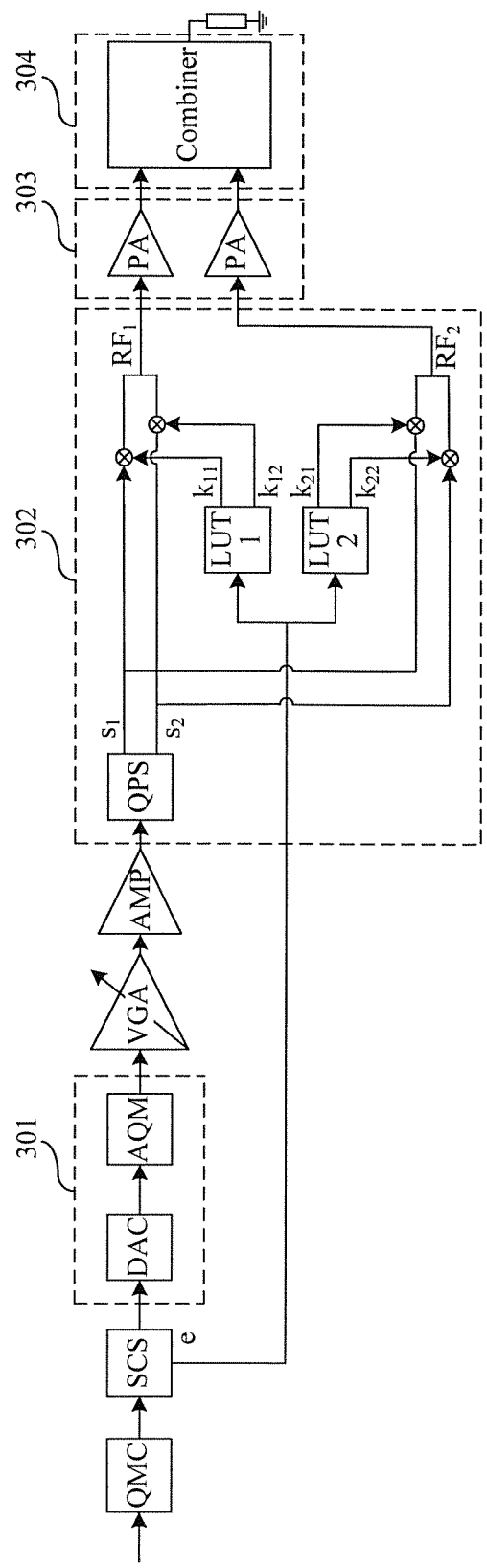
FIG. 6 is a third schematic structural diagram of an implementation of the radio frequency power amplification system according to Embodiment 1 of the present application.

In an actual application scenario, to better ensure system performance, a foremost end of the radio frequency power amplification system is further provided with a QMC (quadrature modulation compensation) module to implement unbalanced compensation for a backend AQM module. A VGA (variable gain adjust) module and an AMP (amplifier) are disposed after the AQM module, to respectively implement gain adjustment and signal amplification on the original radio frequency signal. In this case, the implementation structure of the radio frequency power amplification system is shown in FIG. 6.

Further, the radio frequency signal processing circuit 302 is further configured to determine the preset first correspondence between an envelope of the baseband digital signal and an amplitude and phase adjustment coefficient and the preset second correspondence between an envelope of the baseband digital signal and an amplitude and phase adjustment coefficient.

For example, the radio frequency signal processing circuit 302 may determine the preset first correspondence between an envelope of the baseband digital signal and an amplitude and phase adjustment coefficient in a manner, including but not limited to the following manner:

determining the preset first correspondence between an envelope of the baseband digital signal and an amplitude and phase adjustment coefficient according to the baseband digital signal and a preset first processed radio frequency signal by using a recursive least square algorithm (an RLS algorithm); or determining the preset first correspondence between an envelope of the baseband digital signal and an amplitude and phase adjustment coefficient according to the original radio frequency signal and a preset first processed radio frequency signal by using a recursive least square algorithm.

Correspondingly, the radio frequency signal processing circuit 302 may determine the preset second correspondence between an envelope of the baseband digital signal and an amplitude and phase adjustment coefficient in a manner, including but not limited to the following manner:

determining the preset second correspondence between an envelope of the baseband digital signal and an amplitude and phase adjustment coefficient according to the baseband digital signal and a preset second processed radio frequency signal by using a recursive least square algorithm; or determining the preset second correspondence between an envelope of the baseband digital signal and an amplitude and phase adjustment coefficient according to the original radio frequency signal and a preset second processed radio frequency signal by using a recursive least square algorithm.

The determining the first correspondence and the second correspondence by using the recursive least square algorithm described above is only an example. In another embodiment of the present application, the first correspondence and the second correspondence may also be determined by using another algorithm of the prior art, for example, a least mean square algorithm (an LMS algorithm), which is not specially limited in this embodiment of the present application.

In the radio frequency power amplification system, when working statuses of two power amplifiers remain unchanged, a correspondence between the baseband digital signal and preset two processed radio frequency signals is static at a specific moment. Such a correspondence can be presented by using a correspondence between an envelope of the baseband digital signal and an amplitude and phase adjustment coefficient, which is expressed by a function: F (an envelope of a baseband digital signal)=an amplitude and phase adjustment coefficient. F may be expressed by a polynomial, or may be expressed in another form. When the correspondence between an envelope of the baseband digital signal and an amplitude and phase adjustment coefficient is determined by using a recursive least square algorithm, F may be expressed by a polynomial.

When working statuses of two power amplifiers change, the correspondence between an envelope of the baseband digital signal and an amplitude and phase adjustment coefficient may be updated according to the working statues of the power amplifiers.

By means of the radio frequency power amplification system provided in this embodiment of the present application, signal splitting is performed on a radio frequency signal, multiple complete amplification links are not needed, a system structure is simplified, and a quantity of modules in the system is reduced, which not only reduces system costs, but also reduces nonlinear signal distortion factors, facilitates linear correction, and has a relatively low bandwidth requirement on a DAC and an AQM module, and other modules.

It should be noted that the foregoing specific implementation manners of the radio frequency power amplification system shown in FIG. 4 to FIG. 6 are only examples, and are not used to limit the present application.

In the radio frequency power amplification system provided in the foregoing Embodiment 1 of the present application, an original radio frequency signal is processed to obtain two processed radio frequency signals. In a radio frequency power amplification system provided in another embodiment of the present application, an original radio frequency signal may be processed to obtain more than two processed radio frequency signals, and no further details are provided herein.

Embodiment 2

Embodiment 2 of the present application further provides a transmitter, including the radio frequency power amplification system shown in any one of FIG. 2 to FIG. 6.

The transmitter may further include a filter and an antenna. The filter may be configured to filter a combined signal that is obtained by means of processing by the radio frequency power amplification system, to obtain a signal to be transmitted. The antenna may be configured to transmit the signal to be transmitted.

Embodiment 3

Embodiment 3 of the present application further provides a base station, including the transmitter provided in the foregoing Embodiment 2.

The base station may further include a baseband processing unit (base band unit), configured to generate a baseband digital signal. The transmitter provided in Embodiment 2 may perform power amplification on, filter, or transmit the baseband digital signal.

Embodiment 4

Figure 7:
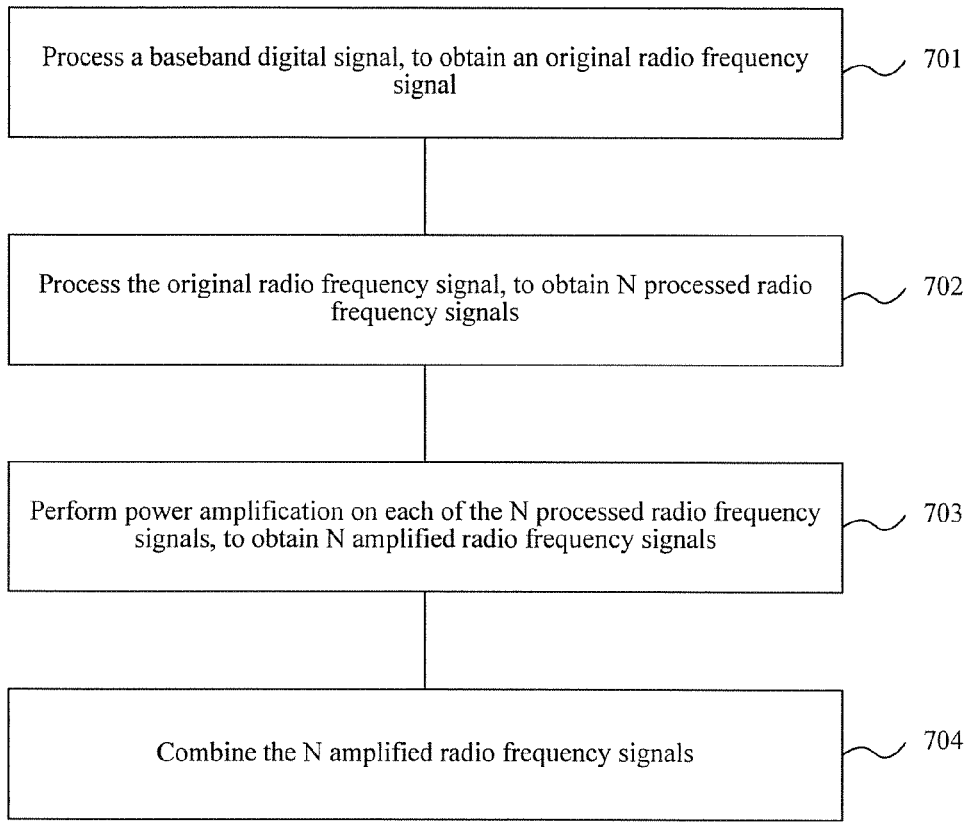
FIG. 7 is a schematic flowchart of a radio frequency power amplification method according to an embodiment of the present application.

Based on a same inventive concept, this embodiment of the present application further provides a radio frequency power amplification method, which, as shown in FIG. 7, includes:

Step 701. Process a baseband digital signal, to obtain an original radio frequency signal.

Step 702. Process the original radio frequency signal, to obtain N processed radio frequency signals, where N is greater than or equal to 2.

Step 703. Perform power amplification on each of the N processed radio frequency signals, to obtain N amplified radio frequency signals.

Step 704. Combine the N amplified radio frequency signals.

Specific forms of the N processed radio frequency signals are not limited in this embodiment of the present application. For example, an equivalent combined signal of i signals of the N processed radio frequency signals and an equivalent combined signal of the rest j signals except the i signals of the N processed radio frequency signals may have equal amplitudes and the amplitudes are all fixed values, and a phase declination of the equivalent combined signal of the i signals that is formed relative to the original radio frequency signal and a phase declination of the equivalent combined signal of the j signals that is fainted relative to the original radio frequency signal have a same value and have opposite directions, where i is greater than or equal to 1, and j is greater than or equal to 1.

Further, step 701 may specifically include:
performing digital-to-analog conversion on the baseband digital signal, to obtain an analog signal; and performing quadrature modulation on the analog signal, to obtain an original radio frequency signal.

Further, step 702 may specifically include:
decomposing the original radio frequency signal, to obtain a first signal component and a second signal component; and
obtaining an $n^{th}$ processed radio frequency signal based on a formula $RF_n = k_{n1} \times s_1 + k_{n2} \times s_2$, where
$n=1, 2, \ldots,$ or N, $RF_n$ is the $n^{th}$ processed radio frequency signal, $s_1$ is the first signal component, $s_2$ is the second signal component, and $k_{n1}$ and $k_{n2}$ are amplitude and phase adjustment coefficients that correspond to the $n^{th}$ processed radio frequency signal at a current moment.

The foregoing specific calculation method for obtaining the $n^{th}$ processed radio frequency signal is only an example, which is not used to limit the present application.

Optionally, the decomposing the original radio frequency signal, to obtain a first signal component and a second signal component in step 702 may specifically include: performing orthogonal decomposition on the original radio frequency signal, to obtain the first signal component and the second signal component.

Further, the radio frequency power amplification method may further include: determining the amplitude and phase adjustment coefficients that correspond to the $n^{th}$ processed radio frequency signal at the current moment, including:
determining, based on a preset $n^{th}$ correspondence between an envelope of the baseband digital signal and an amplitude and phase adjustment coefficient, that an amplitude and phase adjustment coefficient that corresponds to an envelope of the baseband digital signal at the current moment is the amplitude and phase adjustment coefficient that corresponds to the $n^{th}$ processed radio frequency signal at the current moment.

Further, the radio frequency power amplification method may further include: obtaining the envelope of the baseband digital signal at the current moment, including:

performing envelope detection on the baseband digital signal, to obtain the envelope of the baseband digital signal at the current moment; or performing envelope detection on the original radio frequency signal, to obtain the envelope of the baseband digital signal at the current moment.

Further, the radio frequency power amplification method may further include: determining the preset $n^{th}$ correspondence between an envelope of the baseband digital signal and an amplitude and phase adjustment coefficient, including:

determining the preset $n^{th}$ correspondence between an envelope of the baseband digital signal and an amplitude and phase adjustment coefficient according to the baseband digital signal and a preset $n^{th}$ processed radio frequency signal by using a recursive least square algorithm; or determining the preset $n^{th}$ correspondence between an envelope of the baseband digital signal and an amplitude and phase adjustment coefficient according to the original radio frequency signal and a preset $n^{th}$ processed radio frequency signal by using a recursive least square algorithm.

The determining the first correspondence and the second correspondence by using the recursive least square algorithm described above is only an example. In another embodiment of the present application, the first correspondence and the second correspondence may also be determined by using another algorithm of the prior art, for example, a least mean square algorithm (an LMS algorithm), which is not specially limited in this embodiment of the present application.

The foregoing steps may correspond to functions of parts of the system in FIG. 2 to FIG. 6, and no further details are provided herein.

By means of the radio frequency power amplification method provided in this embodiment of the present application, signal splitting is performed on a radio frequency signal, multiple complete amplification links are not needed, a structure of a radio frequency power amplification system is simplified, and a quantity of modules in the system is reduced, which not only reduces system costs, but also reduces nonlinear signal distortion factors, facilitates linear correction, and has a relatively low bandwidth requirement on a DAC and an AQM module, and other modules.

Embodiment 5

Figure 8:
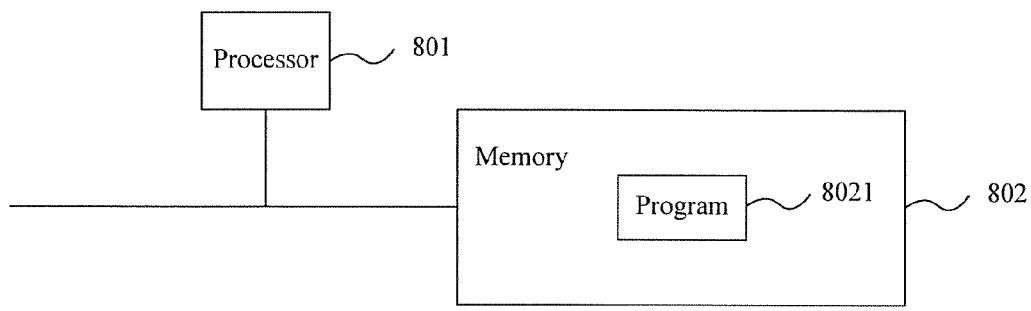
FIG. 8 is a schematic structural diagram of a radio frequency power amplification device according to an embodiment of the present application.

Embodiment 5 of the present application provides a radio frequency power amplification device, and a schematic structural diagram of the radio frequency power amplification device is shown in FIG. 8. The radio frequency power amplification device includes a processor 801, a memory 802, and a communications bus. The communications bus is configured to implement a communications connection between the processor 801 and the memory 802. The processor 801 is configured to execute an application program 8021 stored in the memory 802. The memory 802 may include a high-speed random access memory (RAM), or may include a non-volatile memory, such as a magnetic disk storage. The application program 8021 stored in the memory 802 includes: processing a baseband digital signal, to obtain an original radio frequency signal; processing the original radio frequency signal, to obtain N processed radio frequency signals, where N is greater than or equal to 2; performing power amplification on each of the N processed radio frequency signals, to obtain N amplified radio frequency signals; and combining the N amplified radio frequency signals.

In some implementation manners, an equivalent combined signal of i signals of the N processed radio frequency signals and an equivalent combined signal of the rest j signals except the i signals of the N processed radio frequency signals may have equal amplitudes and the amplitudes are all fixed values, and a phase declination of the equivalent combined signal of the i signals that is formed relative to the original radio frequency signal and a phase declination of the equivalent combined signal of the j signals that is formed relative to the original radio frequency signal have a same value and have opposite directions, where i is greater than or equal to 1, and j is greater than or equal to 1.

In some implementation manners, the application program 8021 may specifically include: performing digital-to-analog conversion on the baseband digital signal, to obtain an analog signal; and performing quadrature modulation on the analog signal, to obtain an original radio frequency signal.

In some implementation manners, the application program 8021 may specifically include: decomposing the original radio frequency signal, to obtain a first signal component and a second signal component; and obtaining an $n^{th}$ processed radio frequency signal based on a formula $RF_n = k_{n1} \times s_1 + k_{n2} \times s_2$, where n=1, 2, . . . , or N, $RF_n$ is the $n^{th}$ processed radio frequency signal, $s_1$ is the first signal component, $s_2$ is the second signal component, and $k_{n1}$ and $k_{n2}$ are amplitude and phase adjustment coefficients that correspond to the $n^{th}$ processed radio frequency signal at a current moment.

In some implementation manners, the application program 8021 may specifically include: performing orthogonal decomposition on the original radio frequency signal, to obtain a first signal component and a second signal component.

In some implementation manners, the application program 8021 may further include: determining the amplitude and phase adjustment coefficients that correspond to the $n^{th}$ processed radio frequency signal at the current moment, including:

determining, based on a preset $n^{th}$ correspondence between an envelope of the baseband digital signal and an amplitude and phase adjustment coefficient, that an amplitude and phase adjustment coefficient that corresponds to an envelope of the baseband digital signal at the current moment is the amplitude and phase adjustment coefficient that corresponds to the $n^{th}$ processed radio frequency signal at the current moment.

In some implementation manners, the application program 8021 may further include: obtaining the envelope of the baseband digital signal at the current moment, including:

performing envelope detection on the baseband digital signal, to obtain the envelope of the baseband digital signal at the current moment; or performing envelope detection on the original radio frequency signal, to obtain the envelope of the baseband digital signal at the current moment.

In some implementation manners, the application program 8021 may further include: determining the preset $n^{th}$ correspondence between an envelope of the baseband digital signal and an amplitude and phase adjustment coefficient, including:
determining the preset $n^{th}$ correspondence between an envelope of the baseband digital signal and an amplitude and phase adjustment coefficient according to the baseband digital signal and a preset $n^{th}$ processed radio frequency signal by using a recursive least square algorithm; or determining the preset $n^{th}$ correspondence between an envelope of the baseband digital signal and an amplitude and phase adjustment coefficient according to the original radio frequency signal and a preset $n^{th}$ processed radio frequency signal by using a recursive least square algorithm.

By means of the radio frequency power amplification device provided in this embodiment of the present application, multiple complete amplification links are not needed, which therefore can reduce nonlinear signal distortion factors, facilitate linear correction, and reduce system costs.

Persons skilled in the art should understand that, although some preferred embodiments of the present application have been described, the persons skilled in the art can make changes and modifications to these embodiments once they learn the basic inventive concept. Therefore, the following claims are intended to be construed as to cover the preferred embodiments and all changes and modifications falling within the scope of the present application.

Obviously, persons skilled in the art can make various modifications and variations to the embodiments of the present application without departing from the spirit and scope of the embodiments of the present application. The present application is intended to cover these modifications and variations provided that they fall within the scope of protection defined by the following claims and their equivalent technologies.

What is claimed is:

1. An apparatus for radio frequency power amplification, the apparatus comprising:
a radio frequency signal generation circuit, configured to process a baseband digital signal, to obtain an original radio frequency signal;
a radio frequency signal processing circuit, configured to:
process the original radio frequency signal, to obtain N processed radio frequency signals, wherein N is greater than or equal to 2,
wherein the radio frequency signal processing circuit is further configured to:
decompose the original radio frequency signal, to obtain a first signal component and a second signal component,
obtain an $n^{th}$ processed radio frequency signal of the N processed radio frequency signals based on a formula $RF_n = k_{n1} \times s_1 + k_{n2} \times s_2$, wherein n=1, 2 . . . or N, $RF_n$ is the $n^{th}$ processed radio frequency signal, $s_1$ is the first signal component, $s_2$ is the second signal component, and $k_{n1}$ and $k_{n2}$ are amplitude and phase adjustment coefficients that correspond to the $n^{th}$ processed radio frequency signal at a current moment,
determine the amplitude and phase adjustment coefficients that correspond to the $n^{th}$ processed radio frequency signal at the current moment, and
determine, based on a preset $n^{th}$ correspondence between an envelope of the baseband digital signal and an amplitude and phase adjustment coefficient that an amplitude and phase adjustment coefficient that corresponds to the envelope of the baseband digital signal at the current moment is the amplitude and phase adjustment coefficient that corresponds to the $n^{th}$ processed radio frequency signal at the current moment;
a power amplifier, configured to perform power amplification on each of the N processed radio frequency signals, to obtain N amplified radio frequency signals; and
a combiner, configured to combine the N amplified radio frequency signals.

2. The apparatus according to claim 1, wherein an equivalent combined signal of i signals of the N processed radio frequency signals and an equivalent combined signal of the j signals except the i signals of the N processed radio frequency signals have equal amplitudes and the amplitudes are all fixed values, wherein i and j are greater than or equal to 1, and a phase declination of the equivalent combined signal of the i signals that is formed relative to the original radio frequency signal and a phase declination of the equivalent combined signal of the j signals that is formed relative to the original radio frequency signal have a same value and have opposite directions.

3. The apparatus according to claim 1, wherein the radio frequency signal processing circuit is further configured to:
perform envelope detection on the baseband digital signal, to obtain the envelope of the baseband digital signal at the current moment.

4. The apparatus according to claim 1, wherein the radio frequency signal processing circuit is further configured to:
perform envelope detection on the original radio frequency signal, to obtain the envelope of the baseband digital signal at the current moment.

5. The apparatus according to claim 1, wherein the radio frequency signal processing circuit is further configured to:
determine the preset $n^{th}$ correspondence between an envelope of the baseband digital signal and an amplitude and phase adjustment coefficient according to the baseband digital signal and a preset $n^{th}$ processed radio frequency signal by using a recursive least square algorithm.

6. The apparatus according to claim 1, wherein the radio frequency signal processing circuit is further configured to:
determine the preset $n^{th}$ correspondence between an envelope of the baseband digital signal and an amplitude and phase adjustment coefficient according to the original radio frequency signal and a preset $n^{th}$ processed radio frequency signal by using a recursive least square algorithm.

7. A radio frequency power amplification method, comprising:
processing a baseband digital signal, to obtain an original radio frequency signal;
processing the original radio frequency signal, to obtain N processed radio frequency signals, wherein N is greater than or equal to 2;
performing power amplification on each of the N processed radio frequency signals, to obtain N amplified radio frequency signals;
combining the N amplified radio frequency signals;
wherein the processing of the original radio frequency signal to obtain the N processed radio frequency signals comprises:
decomposing the original radio frequency signal, to obtain a first signal component and a second signal component, and
obtaining an $n^{th}$ processed radio frequency signal of the N processed radio frequency signals based on a formula $RF_n = k_{n1} \times s_1 + k_{n2} \times s_2$, wherein n=1, 2 . . . or N, $RF_n$ is the $n^{th}$ processed radio frequency signal, $s_1$ is the first signal component, $s_2$ is the second signal component, and $k_{n1}$ and $k_{n2}$ are amplitude and phase adjustment coefficients that correspond to the $n^{th}$ processed radio frequency signal at a current moment;

determining the amplitude and phase adjustment coefficients that correspond to the $n^{th}$ processed radio frequency signal at the current moment; and determining, based on a preset $n^{th}$ correspondence between an envelope of the baseband digital signal and an amplitude and phase adjustment coefficient that an amplitude and phase adjustment coefficient that corresponds to the envelope of the baseband digital signal at the current moment is the amplitude and phase adjustment coefficient that corresponds to the $n^{th}$ processed radio frequency signal at the current moment.

8. The method according to claim 7, wherein an equivalent combined signal of i signals of the N processed radio frequency signals and an equivalent combined signal of the j signals except the i signals of the N processed radio frequency signals have equal amplitudes and the amplitudes are all fixed values, wherein i and j are greater than or equal to 1, and a phase declination of the equivalent combined signal of the i signals that is formed relative to the original radio frequency signal and a phase declination of the equivalent combined signal of the j signals that is formed relative to the original radio frequency signal have a same value and have opposite directions.

9. The method according to claim 7, further comprising: performing envelope detection on the baseband digital signal, to obtain the envelope of the baseband digital signal at the current moment.

10. The method according to claim 7, further comprising: performing envelope detection on the original radio frequency signal, to obtain the envelope of the baseband digital signal at the current moment.

11. The method according to claim 7, further comprising: determining the preset $n^{th}$ correspondence between an envelope of the baseband digital signal and an amplitude and phase adjustment coefficient according to the baseband digital signal and a preset $n^{th}$ processed radio frequency signal by using a recursive least square algorithm.

12. The method according to claim 7, further comprising: determining the preset $n^{th}$ correspondence between an envelope of the baseband digital signal and an amplitude and phase adjustment coefficient according to the original radio frequency signal and a preset $n^{th}$ processed radio frequency signal by using a recursive least square algorithm.

13. A transmitter, comprising: a radio frequency power amplification apparatus, comprising:

a radio frequency signal generation circuit, configured to process a baseband digital signal, to obtain an original radio frequency signal;

a radio frequency signal processing circuit, configured to:
process the original radio frequency signal, to obtain N processed radio frequency signals, wherein N is greater than or equal to 2, wherein the radio frequency signal processing circuit is further configured to:

decompose the original radio frequency signal, to obtain a first signal component and a second signal component, obtain an $n^{th}$ processed radio frequency signal of the N processed radio frequency signals based on a formula $RF_n = k_{n1} \times s_1 + k_{n2} \times s_2$, wherein n=1, 2 ... or N, $RF_n$ is the $n^{th}$ processed radio frequency signal, $s_1$ is the first signal component, $s_2$ is the second signal component, and $k_{n1}$ and $k_{n2}$ are amplitude and phase adjustment coefficients that correspond to the $n^{th}$ processed radio frequency signal at a current moment, determine the amplitude and phase adjustment coefficients that correspond to the $n^{th}$ processed radio frequency signal at the current moment, and determine, based on a preset n correspondence between an envelope of the baseband digital signal and an amplitude and phase adjustment coefficient, that an amplitude and phase adjustment coefficient that corresponds to the envelope of the baseband digital signal at the current moment is the amplitude and phase adjustment coefficient that corresponds to the $n^{th}$ processed radio frequency signal at the current moment;

a power amplifier, configured to perform power amplification on each of the N processed radio frequency signals, to obtain N amplified radio frequency signals; and a combiner, configured to combine the N amplified radio frequency signals.

* * * * *